(12) United States Patent
Hotto

(10) Patent No.: US 8,170,519 B2
(45) Date of Patent: *May 1, 2012

(54) SYSTEM AND METHOD FOR RADIO SIGNAL RECONSTRUCTION USING SIGNAL PROCESSOR

(75) Inventor: Robert Hotto, Carlsbad, CA (US)

(73) Assignee: American Radio LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/964,215

(22) Filed: Dec. 9, 2010

(65) Prior Publication Data

US 2011/0103531 A1    May 5, 2011

Related U.S. Application Data

(63) Continuation of application No. 12/702,498, filed on Feb. 9, 2010, which is a continuation of application No. 11/928,585, filed on Dec. 10, 2007, now Pat. No. 7,831,233, which is a continuation of application No. 11/065,585, filed on Apr. 13, 2005, now Pat. No. 7,433,664, which is a continuation of application No. 10/255,438, filed on Sep. 26, 2002, now Pat. No. 7,043,219, which is a continuation of application No. 09/771,821, filed on Jan. 29, 2001, now Pat. No. 6,577,854, which is a continuation of application No. 09/178,229, filed on Oct. 23, 1998, now Pat. No. 6,236,845, which is a continuation of application No. 08/596,551, filed on Feb. 5, 1996, now Pat. No. 5,864,754.

(51) Int. Cl.
*H04B 1/18* (2006.01)

(52) U.S. Cl. ........ 455/280; 455/295; 455/296; 455/303; 455/307

(58) Field of Classification Search ................ None
See application file for complete search history.

(56) References Cited

U.S. PATENT DOCUMENTS

| | | | |
|---|---|---|---|
| 4,543,532 A | 9/1985 | Kasser | |
| 4,733,403 A | 3/1988 | Simone | |
| 4,878,029 A | 10/1989 | Saulnier et al. | |
| 4,902,979 A | 2/1990 | Puckette, IV | |
| 4,972,436 A | 11/1990 | Halim et al. | |
| 5,058,107 A | 10/1991 | Stone et al. | |
| 5,079,550 A | 1/1992 | Sooch et al. | |
| 5,230,011 A * | 7/1993 | Gielis et al. | ............... 455/324 X |
| 5,375,146 A | 12/1994 | Chalmers | |
| 5,386,438 A | 1/1995 | England | |
| 5,387,913 A | 2/1995 | Park et al. | |
| 5,451,899 A | 9/1995 | Lawton | |
| 5,479,449 A | 12/1995 | Patel et al. | |
| 5,559,514 A | 9/1996 | Thomson | |
| 5,579,347 A | 11/1996 | Lindquist et al. | |
| 5,617,451 A | 4/1997 | Mimura et al. | |

(Continued)

OTHER PUBLICATIONS

E-Systems Team, "New research Lab Leads to Unique Radio Receiver", May 1995, vol. 5, No. 4.

(Continued)

*Primary Examiner* — Philip Sobutka
(74) *Attorney, Agent, or Firm* — John L. Rogitz

(57) ABSTRACT

A waveform reconstruction circuit receives an rf signal from an antenna, digitizes it, and then generates an undistorted reconstructed waveform. The reconstructed waveform can then be conventionally mixed and demodulated to extract useful signal information with enhanced receiver fidelity and sensitivity.

80 Claims, 3 Drawing Sheets

U.S. PATENT DOCUMENTS

| | | | |
|---|---|---|---|
| 5,640,424 | A | 6/1997 | Banavong et al. |
| 5,640,428 | A | 6/1997 | Abe et al. |
| 5,640,670 | A | 6/1997 | Samueli et al. |
| 5,640,698 | A | 6/1997 | Shen et al. |
| 5,673,044 | A | 9/1997 | Pellon |
| 5,742,840 | A | 4/1998 | Hansen et al. |
| 5,754,591 | A | 5/1998 | Samueli et al. |
| 5,757,867 | A | 5/1998 | Caulfield et al. |
| 5,828,955 | A | 10/1998 | Lipowski et al. |
| 5,850,598 | A | 12/1998 | Behrent |
| 5,892,792 | A | 4/1999 | Walley |
| 5,917,872 | A | 6/1999 | Ching |
| 6,035,004 | A | 3/2000 | Nakata |
| 6,064,871 | A | 5/2000 | Leung |

OTHER PUBLICATIONS

Universitat Trier, "MOBICOM 1995: Berkeley, CA, USA, MOBICOM '95, Proceedings of the First Annual International Conference on Mobile Computing and Networking, Nov. 13-15, 1995, Berkeley, CA, ACM, 1995" http://www.informatik.uni-trier.de/~ley/db/conf/mobicom/mobicom1995.html.

David L. Tennenhouse and Vanu G. Bose, "The Spectrum Ware Approach to Wireless Signal Processing", Telemedia Networks and System Group laboratory for Computer Science, MIT, date unknown.

J. Mitola, III, "Software Radios Survey, Critical Evaluation and Future Directions", 1992 IEEE pp. 13-15 to 13-23.

Floyd M. Gardner, "Interpolation in Digital Modems-Part I: Fundamentals", IEEE Transactions on Communications, vol. 41, No. 3, Mar. 1993, pp. 501-507.

Loke Kun Tan and Henry Samueli, "A 200 MHz Quadrature Digital Synthesizer/Mixer in 0.8 um CMOS", IEEE journal of Solid-State Circuits, vol. 30, No. 3, Mar. 1995, pp. 193-200.

Bennett C. Wong and Henry Smaueli, "A 200-MHz All-Digital QAM Modulator and Demodulator in 1.2-um CMOS for Digital Radio Applications", IEEE Journal of Solid-State Circuits, vol. 26, No. 12, Dec. 1991, pp. 1970-1980.

Alsion Brown and Barry Wolt, "Digital L-Band Receiver Architecture with Direct RF Sampling", pp. 209-216, 1994 IEEE.

Jeffrey A. Wepman, "Analong-to-Digial Converters and Their Applications in Radio Receivers", IEEE Communications magazine, pp. 39-45, May 1995.

* cited by examiner

SYSTEM AND METHOD FOR RADIO SIGNAL RECONSTRUCTION USING SIGNAL PROCESSOR

This application is a continuation of U.S. patent application Ser. No. 12/702,498, filed Feb. 9, 2010, which is a continuation of U.S. patent application Ser. No. 11/928,585, filed Dec. 10, 2007, now U.S. Pat. No. 7,831,233, which is a continuation of U.S. patent application Ser. No. 11/065,585, filed Apr. 13, 2005, now U.S. Pat. No. 7,433,664, which is a continuation of U.S. patent application Ser. No. 10/255,438 filed Sep. 26, 2002, now U.S. Pat. No. 7,043,219, which is a continuation of Ser. No. 09/771,821, filed Jan. 29, 2001 now U.S. Pat. No. 6,577,854, which in turn is a continuation of Ser. No. 09/178,229, filed Oct. 23, 1998 now U.S. Pat. No. 6,236,845, which in turn is a continuation of Ser. No. 08/596,551, filed Feb. 5, 1996 now U.S. Pat. No. 5,864,754 all of which are incorporated by reference and priority from all of which is hereby claimed.

FIELD OF THE INVENTION

The present invention relates generally to radio signal processing, and more particularly to systems and methods for reducing distortion in rf signals and thus enhancing the fidelity and sensitivity of radio receivers.

BACKGROUND

Conventional radio receivers function by receiving an rf signal and preamplifying it, and then processing the signal using a superheterodyne structure. The superheterodyne structure, in its simplest configuration, includes a mixer oscillator which mixes the received signal down to an intermediate frequency (IF) signal. The IF signal is then sent through a bandpass filter and demodulated by an envelope detector to recover the information (colloquially referred to as "baseband") that is carried by the received rf signal.

Of importance to the present invention is the fact that rf signals are corrupted by environmental factors during transmission. Conventional superheterodyne structures attempt to correct for signal corruption by suppressing corruption-induced noise using filtering techniques. Unfortunately, such conventional filtering, whether using analog or digital techniques, suppresses both noise and useful signal, thereby reducing the fidelity of the receiver. In other words, although filtering improves the ratio between useful signal and noise (referred to as the signal-to-noise ratio, SNR), it typically reduces system fidelity and signal strength.

Further, during demodulation, the envelope detector of a conventional superheterodyne structure effectively demodulates only one-half cycle, for example, the positive half cycle, of the IF signal. Only one half of the signal need be used, since the information attached to the positive half cycle during transmission is identical to the information attached to the negative half cycle during transmission. Accordingly, the negative half of each cycle of the received rf signal is discarded by the envelope detector, and replaced with a mirror image of the positive half.

It happens, however, that either one of the positive or negative half of a cycle can be distorted asymmetrically from the other half. Consequently, in instances wherein the negative half of a cycle is relatively uncorrupted, but the positive half cycle is corrupted, the opportunity to use the "best" half of a cycle is lost. Thus, the portion of a corrupted IF signal that is ultimately demodulated and output by the envelope detector statistically can be expected to be the corrupt half 50% of the time.

In light of the above discussion as recognized by the present invention, it would be advantageous to analyze both the positive and negative halves of an rf signal cycle and determine which half is the "best" half, and then extract the useful signal from this "best" half. As further recognized by the present invention, it would be advantageous to accomplish such analysis prior to the non-linear transformation of the rf signal to the IF signal during mixing by the oscillator. Stated differently, it would be advantageous to accomplish such analysis prior to mixing, since the mixing function causes certain data in the signal to be irrecoverable and therefore precludes identification of some distortion and corruption in the "true" signal post-mixing. As still further recognized by the present invention, it would be advantageous to adjust signal gam and tuning "on the fly" to account for transmitter frequency drift and for sometimes constantly changing received signal strength at the antenna.

Accordingly, it is an object of the present invention to provide a system and method for reconstructing a radio signal prior to mixing and demodulating the signal. Another object of the present invention is to provide a system and method for reconstructing a radio signal to improve the extraction of useful portions of the originally transmitted signal that had been corrupted. Yet another object of the present invention is to provide a system and method for reconstructing a radio signal which adjusts signal gam and tuning from the antenna on the fly. Still another object of the present invention is to provide a system and method for reconstructing a radio signal which is easy to use and cost-effective.

SUMMARY OF THE INVENTION

An electromagnetic waveform reconstruction device includes an analog to digital converter (ADC) that is electrically connectable to an antenna for receiving an analog electromagnetic signal therefrom and digitizing the signal. The ADC outputs the digitized electromagnetic signal to a digital signal processor (DSP), which in turn outputs a reconstructed electromagnetic signal in accordance with a predetermined reconstruction paradigm. As more fully discussed herein, the DSP is electrically associable with a mixer circuit for sending the reconstructed electromagnetic signal thereto for mixing and demodulating the signal.

Preferably, the electromagnetic signal is an rf signal, and the device further includes a digital to analog converter (DAC) for converting the reconstructed rf signal to an analog reconstructed rf signal, prior to sending the reconstructed rf signal to the mixer circuit. Alternatively, the DSP digitally mixes the reconstructed rf signal and outputs an intermediate frequency (IF) signal to a demodulator.

As envisioned by the preferred embodiment, the DSP includes reconstruction means for effecting method steps to implement the predetermined reconstruction paradigm. In accordance with the present invention, the method steps include receiving both a positive half and a negative half of the digitized rf signal, and then analyzing the positive and negative halves to identify distorted portions and undistorted portions thereof. At least some of the distorted portions are removed and replaced with respective replacement portions. Thereby, the reconstructed rf signal is produced, with each replacement portion being based on at least some of the undistorted portions.

In one presently preferred embodiment, a controller is electrically connected to the DSP. Also, a preamplifier filter circuit (PFC) is electrically connectable to the antenna and to the ADC for amplifying and filtering the analog rf signal from the antenna prior to sending the analog rf signal to the ADC. Moreover, the PFC is also electrically connected to the controller. Advantageously, the PFC includes a frequency bandpass filter for attenuating signals having a frequency not equal to a pass frequency, and the controller dynamically establishes the pass frequency.

Furthermore, in the presently preferred embodiment, the PFC includes an amplifier for increasing, by a gam factor, the amplitude of signals having the pass frequency. As intended by the preferred embodiment, the controller establishes the gain factor. To this end, the DSP outputs a gam adjust signal to the controller when the rf signal input to the DSP is characterized by an amplitude outside of a predetermined amplitude range. Stated somewhat differently, the DSP generates the gam adjust signal when its input signal is characterized by distortions due to a weak or clipped signal, and the DSP generates the gam adjust signal by determining information content of the signal. In response to the gam adjust signal, and the controller dynamically establishes the gain factor based on the gain adjust signal. If desired, the device of the present invention can be combined with an electromagnetic signal transmitter.

In another aspect of the present invention, an rf receiver includes an antenna and a signal reconstruction circuit electrically connected to the antenna. Accordingly, the signal reconstruction circuit receives an analog rf signal from the antenna. Per the principles of the present invention, the signal reconstruction circuit generates a substantially undistorted reconstructed waveform. A mixer circuit is electrically associated with the signal reconstruction circuit for generating an intermediate frequency (IF) signal based on the reconstructed waveform, and a demodulator decodes useful information from the IF signal.

In yet another aspect, a computer-implemented method is disclosed for processing a transmitted electromagnetic signal to extract useful information from the signal. The present method includes receiving the electromagnetic signal and reconstructing it in accordance with a predetermined reconstruction paradigm, and then, after reconstruction, mixing and demodulating the electromagnetic signal to extract useful information therefrom.

In still another aspect, a computer program device includes a computer program storage device which is readable by a digital processing system. A program means is provided on the program storage device, and the program means includes instructions that are executable by the digital processing system for performing method steps for reconstructing an rf signal prior to mixing and demodulating the rf signal. The method steps advantageously include receiving both a positive half and a negative half of the rf signal, and analyzing the positive and negative halves to identify distorted portions and undistorted portions thereof. The method steps further include removing at least some of the distorted portions and replacing each with a respective replacement portion to thereby produce a reconstructed rf signal, with each replacement portion being based on at least some of the undistorted portions.

In another aspect of the present invention, a device is disclosed for dynamically preamplifying and filtering an rf signal from an antenna, prior to mixing and demodulating the signal to extract useful information from it. The device includes a controller and a preamplifier filter circuit (PFC) electrically connectable to the antenna and in electrical communication with the controller for amplifying and filtering the rf signal. Per the present invention, the PFC includes a frequency bandpass filter for attenuating signals having a frequency not equal to a pass frequency. Additionally, the PFC includes an amplifier for increasing, by a gam factor, the amplitude of signals having the pass frequency. The controller dynamically establishes adjusts the pass frequency and gam factor, based on the signal amplitude and distortion.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
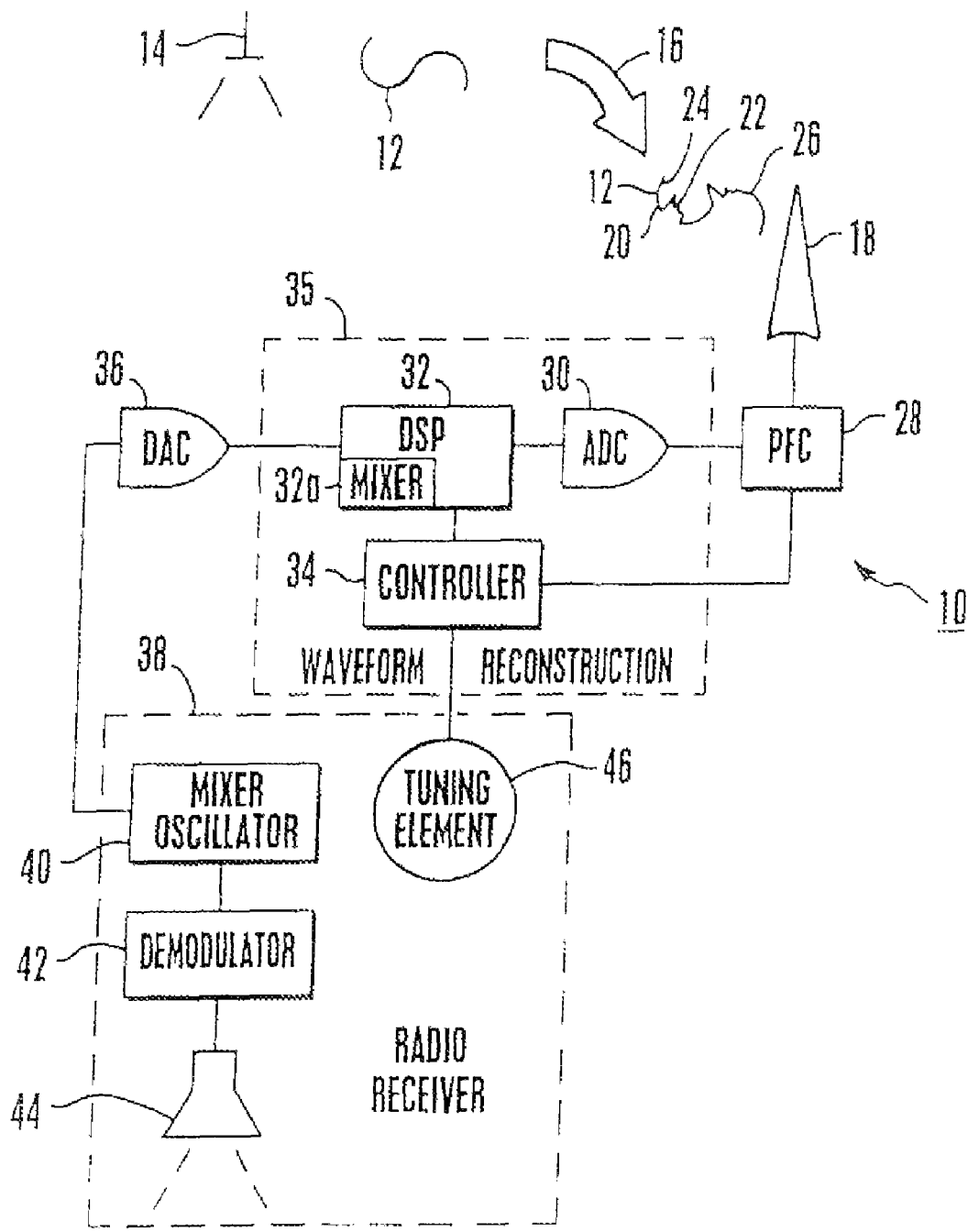
FIG. 1 is a schematic block diagram of the system of the present invention.

Referring initially to FIG. 1, a system, generally designated 10, is shown for reconstructing an rf waveform signal 12 that has been transmitted by an rf transmitter 14, before the signal 12 is mixed and demodulated. As schematically shown in FIG. 1, the rf signal 12 is an analog, sinusoidally-shaped signal that is relatively smooth and undistorted when transmitted, but which can become degraded and distorted as it propagates in the direction of the arrow 16 toward an rf antenna 18. Consequently, upon reaching the antenna 18, a negative half 20 of the rf signal 12 can have distorted portions 22 and undistorted portions 24. Likewise, a positive half 26 the rf signal 12 can have distorted portions and undistorted portions as shown. The present invention is directed to removing distortions from rf signals, prior to mixing and demodulating the signals incident to the decoding of useful information therefrom, thereby improving the fidelity and sensitivity of radio receivers.

While the disclosure herein focuses on rf waveform reconstruction, it is to be understood that the principles of the present invention apply equally to other forms of modulated electromagnetic waves that are modulated as appropriate for the data the waves represent. For example, the principles of the present invention can be applied to processing modulated light waves that are transmitted through fiber optic bundles incident to the transfer of computer, video, or voice data.

FIG. 1 shows that the if signal detected by the antenna 18 is sent to a preamplifying and filtering circuit 28. In accordance with the present invention, the preamplifying and filtering circuit 28 includes an amplifying circuit which preamplifies, by a gain factor, the signal from the antenna 18. Furthermore, the preamplifying and filtering circuit 28 includes a frequency bandpass filter for attenuating signals having a frequency not equal to a pass frequency. As described in greater detail below, the pass frequency and gain factor are dynamically established under the principles of the present invention.

Continuing with the description of FIG. 1, an analog to digital converter (ADC) 30 is electrically connected to the antenna 18 for receiving the analog rf signal therefrom. The ADC 30 is structure well-known in the art that outputs a digitized rf signal in response to the analog rf input from the antenna 18.

Additionally, a digital signal processor (DSP) 32 is electrically connected to the ADC 30. Accordingly, the DSP 32 receives the digitized signal from the ADC 30. Per the present invention, the DSP 32 outputs a reconstructed rf signal in accordance with a predetermined waveform reconstruction paradigm as more fully disclosed below. The reconstructed waveform has substantially no distorted portions. Instead, distorted portions in the input signal to the DSP 32 are replaced by smooth, undistorted portions.

As shown in FIG. 1, a digital computer or controller 34 is electrically connected to or integrated with the DSP 32. In one preferred embodiment, the DSP 32, controller 34, and ADC 30 establish a waveform reconstruction circuit 35. As intended by the present invention, the DSP 32 outputs a gam adjust signal to the controller 34 when the rf signal input to the DSP 32 is characterized by an amplitude outside of a predetermined amplitude range. In other words, when the amplitude of the input signal to the DSP 32 is too high or too low, the DSP 32 sends a gam adjust signal representing this fact to the controller 34.

In turn, the controller 34 is electrically connected to the preamplifying and filtering circuit 28, and the controller 34 dynamically establishes the gain factor of the preamplifying and filtering circuit 28, based on the gain adjust signal. Moreover, the controller 34 can also dynamically establish the pass frequency of the preamplifying and filtering circuit 28, based on the gam adjust signal, to adjust the signal to optimize reception thereof.

After reconstructing the rf waveform, the DSP 32 sends the reconstructed digitized signal to a digital-to-analog converter (DAC) 36, which converts the digitized output of the DSP 32 to an analog waveform. The DAC 36 is in turn electrically connected to the mixing circuit of a radio receiver 38. More specifically, the DAC 36 is electrically connected to an oscillator mixer 40 of the radio receiver 38, and the mixer 40 outputs an intermediate frequency (IF) signal in accordance with principles well-known in the art, based upon the analog signal from the DAC 36. The IF output from the mixer 40 is then sent to a demodulator 42, which decodes the signal to extract useful information therefrom. As but one example of how such useful information is used, an audio speaker 44 can be electrically connected to the demodulator 42 for producing audio signals, based on the output signal of the demodulator 42.

As the skilled artisan will recognize, the configuration shown in FIG. 1 is conducive to operably associating the waveform reconstruction circuit of the present invention with existing conventional radio receivers, in other words, the waveform reconstruction circuit 35 can be implemented in, e.g., a computer chip, and the chip then electrically engaged with a conventional radio receiver between the receiver and antenna as described, for enhancing the fidelity and sensitivity of the radio receiver. Alternatively, a mixer circuit can be incorporated in the DSP 32 to digitally implement the function of the mixer 40 after reconstruction of the waveform. In such an embodiment, the digitized output of the DSP 32 accordingly represents a reconstructed IF signal to be analogized by a DAC and then decoded by a demodulator.

As can be further appreciated in reference to FIG. 1, the radio receiver 38 typically includes one or more a tuning control elements, such as, for example, a knob-like tuning element 46. As is well known in the art, the tuning element 46 is manipulable by a person to establish a channel frequency selection. As shown in FIG. 1, the tuning element 46 is electrically connected to the controller 34, such that the controller 34 can establish the pass frequency based on the channel frequency. As stated above, however, once the channel frequency has been set by a person, the controller 34 can further dynamically vary the pass frequency from the channel frequency as may be required by the gain adjust signal from the DSP 32, to compensate for transmitter 14 frequency drift. Stated differently, because the gain adjust signal generated by the DSP 32 is based on the received rf signal, the controller 34 can dynamically establish the pass frequency and or gain factor, based on the received rf signal.

Figure 2:
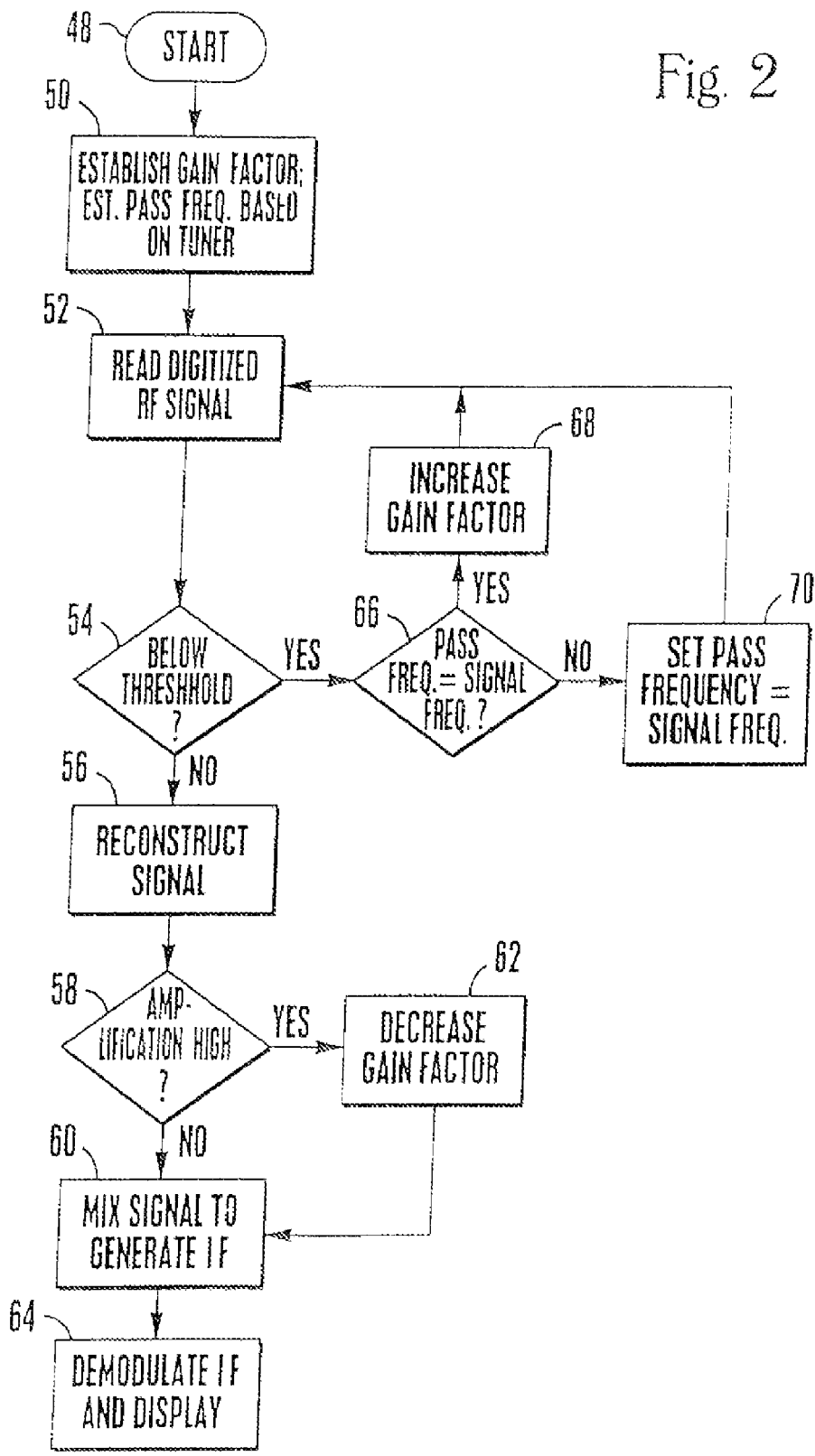
FIG. 2 is a flow chart showing the overall method steps of the present invention.
Figure 3:
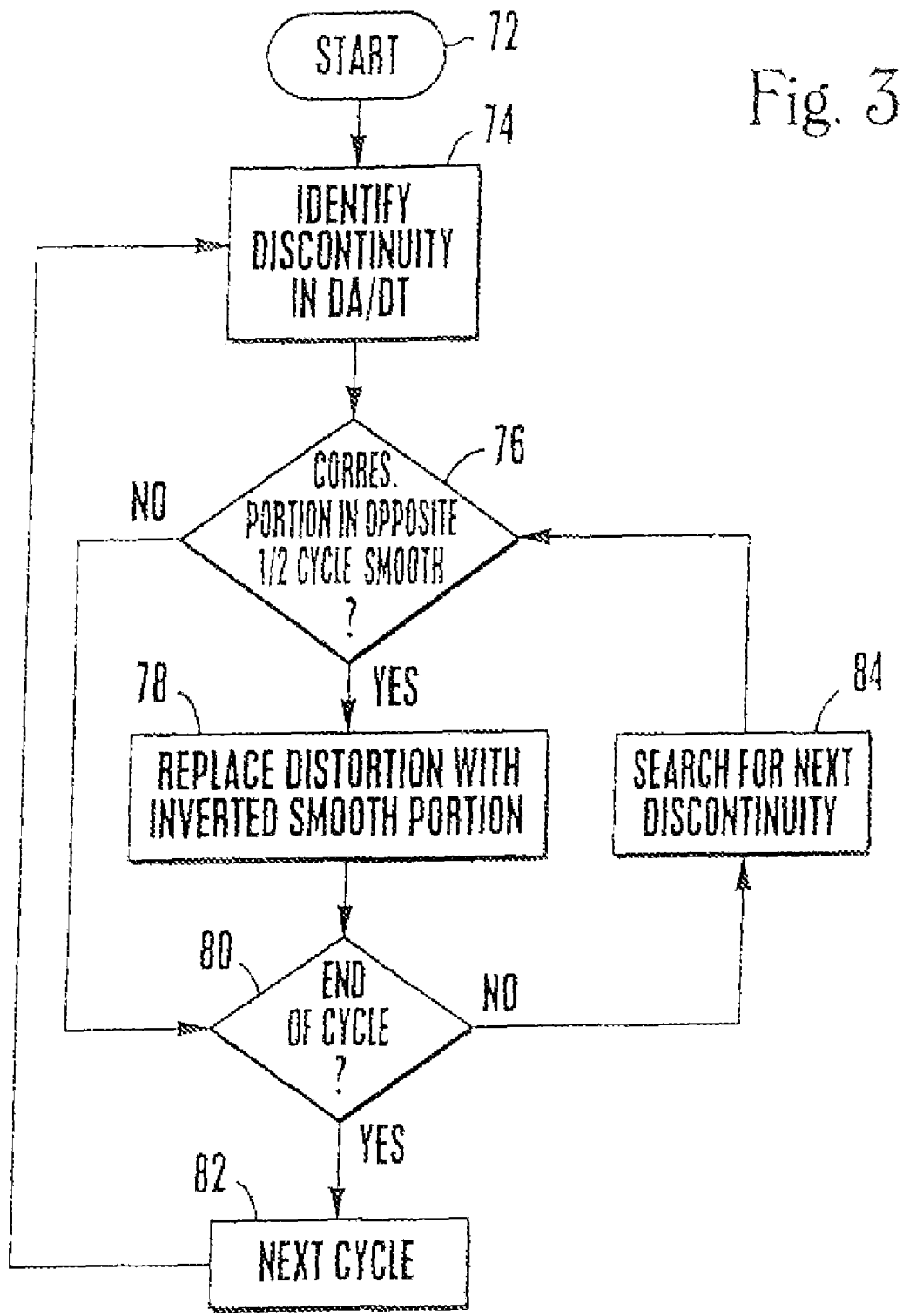
FIG. 3 is a flow chart showing the steps of a waveform reconstruction method in accordance with the present invention.

Now referring to FIGS. 2 and 3, the operational steps of the present invention can be appreciated. It is to be understood that FIGS. 2 and 3 represent logic flow charts of the present reconstruction means for implementing the predetermined reconstruction paradigm of the present invention. As recognized herein, the advantages of the present invention can be realized by removing at least some of the distorted portions of a received waveform and replacing each distorted portion with a respective replacement portion that is based on at least some of the undistorted portions of the received waveform. Thereby, a reconstructed rf signal is produced.

FIGS. 2 and 3 illustrate the logical structure of the waveform reconstruction of the present invention. This logical structure can be embodied in hardware, firmware, or computer program software. When the waveform reconstruction logic is embodied in software, it will be appreciated that the Figures illustrate the structures of computer program code elements that function according to this invention. Manifestly, the software-implemented invention is practiced in its essential embodiment by a machine component that renders the computer program code elements in a form that instructs a digital processing apparatus (that is, a computer) to perform a sequence of function steps corresponding to those shown in the Figures.

These software instructions may reside on a program storage device including a data storage medium, such as may be included in the DSP 32. The machine component in such an embodiment is a combination of program code elements in computer readable form that are embodied in a computer-usable data medium on the DSP 32. Alternatively, such media can also be found in semiconductor devices, on magnetic tape, on optical and magnetic disks, on a DASD array, on magnetic tape, on a conventional hard disk drive, on electronic read-only memory or on electronic ransom access memory, or other appropriate data storage device. In an illustrative embodiment of the invention, the computer-executable instructions may be lines of compiled C++ language code.

Referring particularly to FIG. 2, the waveform reconstruction logic of the DSP 32 begins at start oval 48, wherein positive and negative half cycles of a digitized waveform having distorted and undistorted portions are received from the ADC 30. At block 50, the gain factor and pass frequency of the preamplifying and filtering circuit 28 are established. Initially, the gam factor is established at a default value, and the pass frequency is established to be equal to the channel frequency established by the tuning element 46 (FIG. 1).

Next, at block 52, the digitized rf signal input to the DSP 32 is read. The present logic proceeds to decision diamond 54 to determine whether the amplitude of the input signal is below a predetermined threshold. If not, the logic moves to block 56 to reconstruct the signal as discussed in greater detail below.

From block 56, the logic proceeds to decision diamond 58, wherein it is determined whether the amplification of the reconstructed signal exceeds a predetermined value. If not, the logic proceeds to block 60, wherein the reconstructed signal is mixed (after being analogized, if appropriate) to generate an IF signal.

On the other hand, if, at decision diamond 58, it is determined that the amplification of the reconstructed signal indeed exceeds a predetermined value, the logic proceeds to block 62, wherein the DSP 32 outputs a gam adjust signal to the controller 34 to cause the controller 34 to decrease the gam factor of the preamplifying and filtering circuit 28. From blocks 60 or 62, the logic moves to block 64, wherein the IF signal is demodulated, and the useful information that is thereby extracted is displayed audibly, visually, or indeed stored or otherwise input to a device requiring the information.

Recall that at decision diamond 54 it is determined whether the amplitude of the input signal is below a predetermined threshold. In other words, as recognized by the present invention, the signal input to the DSP 32 should be characterized by an amplitude that is sufficient to permit decoding of useful information from the signal.

If the amplitude is below the threshold, the logic of the present invention proceeds to decision diamond 66, wherein it is determined whether the pass frequency is equal to the frequency of the received rf signal. If it is, the logic moves to block 68, wherein the gam adjust signal from the DSP 32 is generated to cause the controller 34 increase the gam factor of the preamplifying and filtering circuit 28.

In contrast, if, at decision diamond 66, it is determined that the pass frequency is not equal to the frequency of the received rf signal (i.e. that the pass frequency is not optimized for receiving the desired rf signal), the logic moves to block 70. As shown in Figure, at block 70, the controller 34 dynamically vanes the pass frequency to set the pass frequency equal to the frequency of the received rf signal. From blocks 68 and 70, the logic returns to block 52.

Now referring to FIG. 3, the details of one embodiment of the waveform reconstruction paradigm of she present invention are shown. The paradigm begins at start oval 72, and moves to block 74, wherein discontinuities in the slope (referred to as "dA/dt") of the input waveform to the DSP 32 are identified. As recognized by the present invention, such discontinuities should not exist in a perfect waveform, and consequently indicate distorted portions of the waveform. On the other hand, a smooth slope (i.e. dA/dt is a smooth sinusoidal function) indicates an undistorted waveform portion.

From block 74, the logic proceeds to decision diamond 76, wherein it is determined whether the corresponding waveform portion in the opposite half-cycle that corresponds to the distorted portion is smooth (i.e. whether dA/dt of the corresponding waveform portion is a smooth sinusoidal function). By "corresponding waveform portion" is meant the portion of the waveform that occupies the segment along the time axis in the opposite half-cycle from the distorted portion which corresponds to the segment along the time axis occupied by the distorted portion in its own half-cycle.

If the test at decision diamond 76 is positive, the logic moves to block 78, wherein the distorted portion is replaced with the inverse of the corresponding waveform portion. Next, the logic moves to decision diamond 82, wherein it is determined whether the complete waveform cycle (i.e., one positive half-cycle and its negative half-cycle; has been analyzed. If it has been, the process proceeds to block 82, to analyze the next cycle, returning to block 74. Otherwise, the process proceeds to block 84 to search for the next discontinuity in the current cycle, thence to loop back to decision diamond 76. Also, if the test at decision diamond 76 is negative, the process skips to decision diamond 80.

It is to be understood that the waveform reconstruction paradigm of the present invention may use analysis methods other than the one shown in FIG. 3. For example, a fast Fourier transform (FFT) may be used to reconstruct a smooth waveform from a distorted waveform by replacing the distorted input waveform with a series of smooth regular waveforms from a waveform library, with each replacement waveform having a unique frequency and an amplitude based upon its relative contribution to the reconstructed waveform. Accordingly, using FFT analysis, distorted portions of waveforms are replaced by smooth portions, with the smooth portions being based in accordance with FFT principles on the undistorted portions of the input waveform.

As yet another alternative, distorted portions of the input waveform can be replaced by smooth portions that are based on the undistorted portions of the input waveform using so-called "wavelet analysis". In wavelet analysis, small undistorted waveform segments are stored in a library and are fitted to the undistorted portions of the input waveform as needed to replace distorted waveform portions. Examples of such analysis are disclosed by, e.g., Donoho in "Nonlinear Wavelet Methods for Recovery of Signals, Densities, and Spectra from Indirect and Noisy Data". *Proceedings of Symposia in Applied Mathematics*, Vol. 00, 1993 (American Mathematical Society); Basseville et al. "Modeling and Estimation of Multiresolution Stochastic Processes". *IEEE Transactions on Informational Theory*, vol. 38 no 2, 1992 (IEEE), and Coifman et al., "Wavelet Analysis and Signal Processing", pps. 153-178, Jones and Barlett, Boston, Mass. 1992, all of which publications are incorporated herein by reference.

While the particular SYSTEM AND METHOD FOR RADIO SIGNAL RECONSTRUCTION USING SIGNAL PROCESSOR as herein shown and described in detail is fully capable of attaining the above-described objects of the invention, it is to be understood that it is the presently preferred embodiment of the present invention and is thus representative of the subject matter which, is broadly contemplated by the present invention, that the scope of the present invention fully encompasses other embodiments which may become obvious to those skilled in the art, and that the scope of the present invention is accordingly to be limited by nothing other than the appended claims.

What is claimed is:

1. An apparatus comprising:
a converter receiving as input an rf signal that has not been downconverted in the analog domain to IF, the converter outputting a digitized signal representing the rf signal; and
a hardware module electrically connected to the converter, the module being configured with software to decode and extract baseband information from the digitized signal, wherein the module replaces at least one distorted portion of the signal with a replacement portion.

2. An apparatus, comprising:
a reconstruction circuit receiving an analog sinusoidal signal and generating a reconstructed waveform having substantially no distortions therein, wherein the reconstruction circuit includes:
a converter receiving the analog sinusoidal signal that has not been downconverted in the analog domain by the reconstruction circuit and outputting a digitized signal in response; and
a module electrically connected to the converter for outputting the reconstructed waveform in accordance with a predetermined reconstruction paradigm which includes generating the reconstructed waveform using at least portions of the digitized signal.

3. The apparatus of claim 2, wherein the paradigm includes replacing at least one distorted portion of the signal with a replacement portion that is based on at least some undistorted portions of the signal.

4. A device, comprising:
a circuit receiving an analog waveform carried in an optical transmission line, wherein the circuit includes:

an element for receiving the signal prior to any extraction of baseband information therefrom and outputting a non-continuous signal in response;

an element receiving the non-continuous signal and repairing at least a portion of the non-continuous signal prior to the extraction of baseband information from the non-continuous signal; and at least one module electrically connected to the element receiving the non-continuous signal and in response outputting a baseband waveform.

5. The receiver of claim 4, wherein a reconstruction paradigm is applied to the non-continuous signal, the reconstruction paradigm including replacing at least one distorted portion of the signal with a replacement portion that is based on at least some undistorted portions of the signal.

6. A method, comprising:

converting a continuous signal that has not been downconverted and demodulated in the analog domain into a non-continuous signal, the continuous signal being a carrier for baseband information;

repairing the non-continuous signal prior to completing a downconversion operation;

generating, subsequent to the repairing, a digitized signal from the non-continuous signal; and extracting the baseband information from the digitized signal without converting the digitized signal to the analog domain.

7. The method of claim 6, wherein the repairing is executed in the RF domain.

8. The method of claim 6, wherein the repairing includes signal reconstruction of distorted portions of the signal using the non-continuous signal.

9. A device, comprising:

a circuit configured to receive an analog waveform carried in an optical transmission line, wherein the circuit includes:

at least a first subcircuit configured to receive the signal prior to any extraction of baseband information therefrom and to output a non-continuous signal in response;

at least a second subcircuit receiving the non-continuous signal, the second subcircuit repairing at least portions of the non-continuous signal; and at least one processing assembly electrically connected to the second subcircuit to receive the non-continuous signal and in response to output a baseband waveform.

10. The receiver of claim 9, wherein a reconstruction paradigm is applied to the non-continuous signal, the reconstruction paradigm including replacing at least one distorted portion of the signal with a replacement portion that is based on at least some undistorted portions of the signal.

11. A method, comprising:

converting a continuous carrier signal that has not been downconverted and demodulated in the analog domain into a non-continuous signal;

reconstructing the non-continuous signal prior to completing a downconversion operation;

generating, subsequent to the reconstructing, a digitized signal; and extracting baseband information from the digitized signal without analogizing the digitized signal.

12. The method of claim 11, wherein the repairing is executed in the RF domain.

13. The method of claim 11, wherein the repairing includes signal reconstruction of distorted waveform portions using the non-continuous signal.

14. A method, comprising:

converting a continuous RF signal that has not been downconverted and demodulated in the analog domain into a non-continuous signal, the RF signal being received from a signal path that includes at least one optical transmission line;

reconstructing at least one distorted portion of the non-continuous signal prior to completing a downconversion operation;

generating, subsequent to the processing, a digitized signal; and extracting baseband information from the digitized signal.

15. The method of claim 14, wherein the reconstructing is effected on the non-continuous signal while still in the RF domain.

16. An article of manufacture, comprising:

a circuit receiving an analog waveform carried in an optical transmission line and conveying baseband information useful for display to a person, wherein the circuit includes:

at least one subcircuit receiving the signal prior to any extraction of baseband information therefrom and outputting a non-continuous signal in response; and at least one processing assembly electrically connected to the subcircuit and receiving the non-continuous signal and in response outputting a baseband waveform from which baseband information for display is obtained while still in the digital domain, the processing assembly repairing at least one portion of the non-continuous signal.

17. The receiver of claim 16, wherein the processing assembly repairs the at least one portion of the non-continuous signal before rendering the baseband waveform.

18. An apparatus comprising:

a converter receiving as input an rf signal that has not been downconverted and demodulated in the analog domain, the converter outputting a digitized signal representing the rf signal; and a module electrically connected to the converter, the module being configured to decode and extract baseband information from the digitized signal without requiring the digitized signal to be converted to the analog domain prior to extracting the baseband information therefrom, wherein the module reconstructs irregularities in the digitized signal prior to extracting the baseband information therefrom.

19. The apparatus of claim 18, wherein the module replaces at least one distorted portion of the signal with a replacement portion.

20. The apparatus of claim 18, wherein the apparatus amplifies the rf signal.

21. The apparatus of claim 18, wherein the apparatus filters the rf signal.

22. An electronic assembly comprising:

a receiving circuit receiving as input an rf signal that has not been downconverted by the assembly in the analog domain, the receiving circuit outputting a digitized signal representing the rf signal; and a module electrically connected to the receiving circuit, the module being configured to decode and extract, in the digital domain, baseband information from the digitized signal, wherein the module reconstructs at least portions of the digitized signal while in the digital domain.

23. The assembly of claim 22, wherein the module replaces at least one distorted portion of the signal with a replacement portion.

24. The assembly of claim 22, wherein the module reconstructs at least portions of the digitized signal while in the digital RF domain.

25. The assembly of claim 22, wherein the assembly filters the rf signal.

26. An electronic assembly comprising:
a receiving circuit receiving as input an rf signal that has not been downconverted by the assembly to an intermediate frequency (IF) from which baseband information is decoded, the receiving circuit outputting a digitized signal representing the rf signal; and
a module electrically connected to the receiving circuit, the module being configured to decode and extract baseband information from the digitized signal while the digitized signal remains in the digital domain, wherein the module reconstructs at least one portion of the signal.

27. The assembly of claim 26, wherein the wherein the module replaces at least one distorted portion of the signal with a replacement portion prior to any downconversion and/or demodulation of the digitized signal by the assembly.

28. The assembly of claim 26, wherein the assembly filters the rf signal.

29. An electronic assembly comprising:
a receiving circuit configured to receive as input an rf signal that has not been downconverted by the assembly to a frequency from which baseband information is decoded, the receiving circuit configured to output a digitized signal representing the rf signal with at least one distorted portion of the digitized signal being corrected; and
a module electrically connected to the receiving circuit, the module being configured to decode and extract baseband information from the digitized signal with the digitized signal remaining in the digital domain.

30. The assembly of claim 29, wherein the module is configured to replace at least one distorted portion of the signal with a replacement portion.

31. The assembly of claim 29, wherein the assembly is configured to amplify the rf signal.

32. The assembly of claim 29, wherein the assembly is configured to filter the rf signal.

33. An electronic assembly comprising:
a receiving circuit configured to receive as input an rf signal that has not been downconverted by the electronic assembly in the analog domain, the receiving circuit configured to output a digitized signal representing the rf signal; and
a module electrically connected to the receiving circuit, the module being configured to decode and extract baseband information from the digitized signal, the digitized signal remaining digitized during extraction of baseband information therefrom, the receiving circuit and/or module reconstructing, in a digital domain, at least one portion of the rf signal as received in the analog domain, prior to any extraction of baseband information from the digitized signal.

34. The assembly of claim 33, wherein the module is configured to replace at least one distorted portion of the signal with a replacement portion.

35. The assembly of claim 33, wherein the assembly is configured to amplify the rf signal.

36. The assembly of claim 33, wherein the assembly is configured to filter the rf signal.

37. An electronic assembly comprising:
a receiving circuit configured for receiving as input an rf signal that has not been downconverted to an intermediate frequency (IF) from which baseband information is decoded, the receiving circuit configured for outputting a digitized signal representing the rf signal; and
a module electrically connected to the receiving circuit, the module being configured to decode and extract baseband information from the digitized signal while the digitized signal remains in the digital domain, wherein the module replaces at least one distorted portion of the signal with a replacement portion.

38. The assembly of claim 37, wherein the module replaces at least one distorted portion of the signal with a replacement portion prior to downconverting the digitized signal from the RF domain.

39. The assembly of claim 37, wherein the assembly amplifies the rf signal.

40. The assembly of claim 37, wherein the assembly filters the rf signal.

41. A receiver, comprising:
an incoming signal port at which an rf signal that has propagated through a transmission medium is received;
a converter downstream of the incoming signal port and receiving an analog signal from downstream of the incoming signal port, the converter outputting a non-analog signal representative of the analog signal; and
a digital processor electrically connected to the converter, the digital processor being configured to extract base band information from the non-analog signal without converting the non-analog signal to the analog domain after first reducing distortion in the digitized signal.

42. The receiver of claim 41, wherein the digital processor is configured to reconstruct at least some distorted portions of the signal being processed, wherein at least one distorted portion is reconstructed by replacing the distorted portion with an undistorted portion.

43. The receiver of claim 41, wherein the converter digitizes the analog signal prior to any demodulation thereof.

44. The receiver of claim 41, further comprising a mixer generating an intermediate frequency (IF) signal based on the non-analog signal, and a demodulator decoding useful information from the IF signal, wherein at least the mixer and demodulator are embodied in the digital processor.

45. The receiver of claim 41, wherein the incoming signal port is coupled to an antenna.

46. A receiver, comprising:
an input;
a converter downstream of the input and receiving an analog signal therefrom, the converter outputting a non-analog signal representative of the analog signal; and
a digital processor electrically connected to the converter, the digital processor being programmed with software to improve the extraction of useful portions of the analog signal that had been corrupted and then to extract base band information from the non-analog signal.

47. The receiver of claim 46, wherein the digital processor is configured to reconstruct at least some distorted portions of the signal being processed, wherein at least one distorted portion is reconstructed by replacing the distorted portion with an undistorted portion.

48. The receiver of claim 46, wherein the converter digitizes the analog signal prior to any demodulation thereof.

49. The receiver of claim 46, further comprising a mixer generating an intermediate frequency (IF) signal based on the non-analog signal, and a demodulator decoding useful information from the IF signal, wherein at least the mixer and demodulator are embodied in the digital processor.

50. The receiver of claim 46, wherein the input is coupled to an antenna.

51. A receiver of wireless voice data, comprising:
- a signal input;
- an analog to digital converter (ADC) downstream of the signal input and receiving an rf signal having distortions from the signal input and configured to output a digitized signal representative of the rf signal; and
- a module electrically connected to the ADC, the module being configured to generate a substantially undistorted reconstructed waveform from the digitized signal and then to extract baseband information from the digitized signal prior to any analogization of the digitized information, the baseband information representing at least in part voice data.

52. The receiver of claim 51, wherein the signal input is connected to an antenna receiving the rf signal.

53. The receiver of claim 51, wherein the module includes a digital signal processor (DSP).

54. The receiver of claim 51, wherein the module is configured to reconstruct at least some distorted portions of the signal being processed, wherein the at least some distorted portions are identified by slope discontinuities.

55. The receiver of claim 51, wherein at least one distorted portion is reconstructed by replacing the distorted portion with an undistorted portion, the undistorted portion being an inverse in the signal of the distorted portion.

56. An rf receiver, comprising:
- a signal input configured to receive an rf signal;
- a converting component receiving the rf signal from the signal input and configured to output a non-continuous representation thereof; and
- a processing component receiving the non-continuous representation from the converting component and extracting baseband information therefrom prior to any conversion of the non-continuous representation to a continuous representation, the processing component reconstructing the signal in the non-continuous domain prior to extracting baseband information.

57. The receiver of claim 56, wherein the converting component is established by an analog-to-digital converter (ADC).

58. The receiver of claim 56, wherein the processing component is established by a digital signal processor (DSP).

59. The receiver of claim 56, wherein the signal input receives rf from an antenna connected thereto.

60. The receiver of claim 56, wherein the processing component uses a fast Fourier transform (FFT) to reconstruct a distorted portion of the rf.

61. The receiver of claim 56, wherein the processing component uses wavelet analysis to reconstruct a distorted portion of the rf.

62. A radio, comprising:
- a signal input;
- an analog to digital converter (ADC) electrically connected to the signal input and outputting a digitized signal representative of an analog signal received at the signal input prior to rendering an IF signal or a demodulated signal;
- a digital processor electrically connected to the ADC, the digital processor being configured to decode and extract information from the digitized signal;
- a mixer generating an intermediate frequency (IF) signal based on the waveform; and
- a demodulator decoding useful information from the IF signal, wherein at least the mixer and demodulator are embodied in the digital processor.

63. A receiver, comprising:
- a filtering circuit receiving and filtering an electromagnetic signal;
- an analog to digital converter (ADC) electrically connected to the filtering circuit and outputting a digitized signal representative of the electromagnetic signal; and
- a digital processor electrically connected to the ADC, the digital processor reconstructing at least one corrupted portion of the signal prior to extracting useful information from the digitized signal representative of the electromagnetic signal while the digitized signals remains a digitized signal.

64. The receiver of claim 63, wherein the digital processor reconstructs the digitized signal.

65. The receiver of claim 63, wherein the ADC digitizes the signal prior to any analog demodulation thereof.

66. The receiver of claim 63, wherein the filtering circuit is controlled and tuned by the processor.

67. The receiver of claim 63, further comprising an amplifier connected to the filter.

68. The receiver of claim 67, wherein the filtering circuit is controlled and tuned by the processor.

69. The receiver of claim 63, wherein the processor reconstructs the digitized signal such that spurious signal elements and noise are removed therefrom.

70. The receiver of claim 63, wherein the processor reconstructs the digitized signal such that a desired signal is enhanced and amplified.

71. An rf receiver, comprising:
- a signal input;
- a filtering circuit electrically connected to the signal input;
- an analog to digital converter (ADC) electrically connected to the filtering circuit for receiving an analog signal therefrom and outputting a digitized signal in response, the analog signal having corruptions;
- a digital signal processor (DSP) electrically connected to the ADC, the DSP digitally generating a baseband signal representing baseband information carried by the analog signal, the baseband signal not being analog, the baseband signal being repaired relative to the analog signal in that portions of the baseband signal corresponding to the corruptions in the analog signal are not corrupted.

72. The receiver of claim 71, wherein the DSP generates a reconstructed waveform using the analog signal.

73. The receiver of claim 71, wherein the DSP outputs the reconstructed waveform in accordance with a predetermined reconstruction paradigm.

74. The receiver of claim 71, wherein the DSP includes reconstruction means for effecting method steps to implement a predetermined reconstruction paradigm, the method steps including:
  (a) receiving both a positive half and a negative half of the digitized rf signal;
  (b) analyzing the positive and negative halves to identify distorted portions and undistorted portions thereof; and
  (c) removing at least some of the distorted portions and replacing each with a respective replacement portion to thereby produce the reconstructed waveform, each replacement portion being based on at least some of the undistorted portions.

75. The receiver of claim 71, wherein the filtering circuit includes a preamplifier filter circuit (PFC) electrically connected to an antenna and ADC for amplifying and filtering a signal from the antenna prior to sending the signal to the ADC, wherein the PFC includes:

a frequency bandpass filter for attenuating signals having a frequency not equal to a pass frequency, the pass frequency being dynamically established; and an amplifier for increasing, by a gain factor, the amplitude of signals having the pass frequency.

76. The receiver of claim 75, further comprising a tuning control element for establishing a pass frequency, wherein the DSP outputs a gain adjust signal when the rf signal input to the DSP is characterized by an amplitude outside of a predetermined amplitude range the gain factor based on the gain adjust signal; and wherein the pass frequency is established based on at least one of: the pass frequency, and the gain adjust signal.

77. The receiver of claim 76, in combination with an rf transmitter.

78. A method for processing a modulated signal, comprising:

receiving the modulated signal;

converting the signal to a digital signal prior to extracting more than one IF signal therefrom, for subsequent processing of the digital signal to extract from the digital signal while in the digital domain baseband information carried by the modulated signal; and reconstructing distorted signal portions while in the digital domain, the reconstructing not including only downconversion or demodulation.

79. The method of claim 78, wherein the reconstructing is effected prior to rendering the digital signal to the baseband domain.

80. An apparatus comprising:

a converter receiving as input an analog signal of a first frequency that has not been downconverted in the analog domain by the apparatus, the converter outputting a digitized signal representing the analog signal; and a hardware module electrically connected to the converter, the module being configured with software to decode and extract baseband information from the digitized signal, wherein the module uses the digitized signal to generate a reconstructed waveform of a second frequency different from the first frequency.

* * * * *